United States Patent

Suplinskas

(10) Patent No.: US 8,163,344 B2
(45) Date of Patent: Apr. 24, 2012

(54) METHOD FOR THE FORMATION OF DOPED BORON

(75) Inventor: Raymond J. Suplinskas, Haverhill, MA (US); Janet Suplinskas, legal representative, Haverhill, MA (US)

(73) Assignee: Specialty Materials, Inc., Lowell, MA (US)

( * ) Notice: Subject to any disclaimer, the term of this patent is extended or adjusted under 35 U.S.C. 154(b) by 382 days.

(21) Appl. No.: 11/937,092

(22) Filed: Nov. 8, 2007

(65) Prior Publication Data

US 2008/0056976 A1 Mar. 6, 2008

Related U.S. Application Data

(60) Continuation of application No. 10/989,803, filed on Nov. 17, 2004, now Pat. No. 7,294,606, which is a division of application No. PCT/US03/20628, filed on Jul. 1, 2003.

(60) Provisional application No. 60/429,137, filed on Nov. 26, 2002.

(51) Int. Cl.
*C01B 35/02* (2006.01)
*C23C 16/22* (2006.01)
*C23C 16/28* (2006.01)

(52) U.S. Cl. ............ 427/255.38; 423/265; 423/298

(58) Field of Classification Search ............. 427/255.38, 427/215, 445; 423/289, 298, 265
See application file for complete search history.

(56) References Cited

U.S. PATENT DOCUMENTS

| 4,481,257 A | 11/1984 | Suplinskas et al. |
| 5,643,514 A | 7/1997 | Chwastiak et al. |
| 5,952,100 A | 9/1999 | Corman et al. |
| 7,294,606 B2 * | 11/2007 | Suplinskas et al. ............ 505/100 |

OTHER PUBLICATIONS

Finnemore, D.K., et al. "CVD routes to MgB2 conductors", Physica C, North-Holland Publishing, Amsterdam, NL, vol. 385, No. 1-2, Mar. 1, 2003, pp. 278-285.
International Search Report dated Jan. 15, 2010 issued in corresponding International Application No. EP 03811988.

* cited by examiner

*Primary Examiner* — Wayne Langel
(74) *Attorney, Agent, or Firm* — Onello & Mello, LLP

(57) ABSTRACT

A chemically doped boron coating is applied by chemical vapor deposition to a silicon carbide fiber and the coated fiber then is exposed to magnesium vapor to convert the doped boron to doped magnesium diboride and a resultant superconductor.

29 Claims, No Drawings

METHOD FOR THE FORMATION OF DOPED BORON

RELATED APPLICATIONS

This application is a continuation of U.S. application Ser. No. 10/989,803, filed on Nov. 17, 2004, which relies for priority upon International Application No. PCT/US03/20628 filed on Jul. 1, 2003, which claims the benefit of U.S. Provisional Application Ser. No. 60/429,137, filed Nov. 26, 2002, the contents of which are herein incorporated by reference in their entirety.

BACKGROUND OF THE INVENTION

It has been discovered that magnesium diboride is a superconductor with a transition temperature of approximately 40 K. Magnesium diboride can be made by the reaction of elemental magnesium and boron. The result of this process is a fine powder which is commercially available. Experiments on small crystals of this material have demonstrated high current-carrying capabilities at high magnetic fields, properties which could make MgB2 very useful in applications such as magnetic resonance imaging (MRI) where large powerful magnets are required. Magnesium diboride, however is an intractable material with respect to the usual drawing processes for forming the continuous wires required for such applications.

Magnesium diboride wires have been formed by a "powder-in-tube" process in which a tube of cladding material is filled with the fine powder and the composite tube is then drawn to smaller diameter. (S. Jin et al, high Critical Currents in Iron-clad Superconducting MgB2 Wires, Nature, Vol. 410, 63 (2001)). This process is expensive and may not lead to optimum properties in the fabricated wire.

Another approach to forming MgB2 wires has been to convert boron filaments by reaction with magnesium vapor. Boron filaments are formed in a continuous chemical vapor deposition (CVD) process; 100 micron diameter boron filaments on a 12 micron tungsten substrate are commercially available in lengths exceeding several kilometers. Segments of these filaments were reacted with magnesium vapor in sealed tantalum tubes. (Canfield et al, Superconductivity in Dense MgB2 Wires, Phys. Rev. Lett., Vol. 86, 2424 (2001)). The filament segments retained the shape of wires after conversion to MgB2, and exhibited good superconducting properties. However, the resulting wires were fragile and difficult to handle.

One objective of the invention disclosed below is to form a boron substrate which can be converted to magnesium diboride in continuous wire form while still retaining both good superconducting properties and good mechanical properties such as handleability.

Another aspect of the superconducting behavior of MgB2 is the effect of impurities. Impurity sites can enhance the current-carrying capability of a superconductor by "pinning" magnetic vortices; the restrained vortices allow the sample to retain a zero electrical resistance. (Canfield and Bud'ko, Physics World, 29, Jan. 2001.) Impurities which have been found useful for enhancing the properties of MgB2 include magnesium oxide, carbon, silicon carbide and titanium diboride.

Another objective of this invention is to provide a continuous boron substrate doped in a controlled manner by chemical vapor deposition with atomic species which will, upon conversion of the boron to MgB2, form "pinning" sites which will enhance the current-carrying capability of the resulting superconductor.

SUMMARY OF THE INVENTION

In this invention, chemically doped boron coatings are applied by chemical vapor deposition to silicon carbide fibers; these coated fibers are then exposed to magnesium vapor to convert the doped boron to doped magnesium diboride. The silicon carbide fibers are the commercially available SCS-9 or 9A (nominal 3 mil diameter) or SCS-6 (5.6 mil diameter). These silicon carbide fibers exhibit high mechanical properties with tensile strength typically in excess of 500 kpsi and Young's modulus in excess of 50 mpsi. The SCS fibers have a carbonaceous surface layer which enhances the use of the fibers in composite applications. Silicon carbide fibers can also be produced without a carbon-rich surface layer. The chemically doped boron coatings are produced by the controlled addition of a dopant vapor to the gas stream normally used to deposit boron. In this way the concentration of the dopant in the coating can be controlled. For example, addition of titanium tetrachloride vapor to the roughly stoichiometric hydrogen and boron trichloride mixture normally used to deposit boron will result in the deposition of boron doped with titanium diboride, and the concentration of the titanium diboride can be controlled through the vapor pressure of titanium tetrachloride. When the (B/TiB2)-coated SiC is then exposed to magnesium vapor at high temperature, the result is a robust SiC fiber coated with magnesium diboride doped with titanium diboride.

Another useful dopant for magnesium diboride is magnesium oxide. This can be produced by adding controller amounts of $B_3O_3Cl_3$ to the gas stream used for boron deposition. The oxygen-doped boron thus produced will convert to magnesium oxide-doped magnesium diboride upon processing as above.

Silicon carbide has been shown to be a useful dopant for magnesium diboride. The doped MgB2 was prepared in pellet form by the reaction of a mixture of boron, magnesium and silicon carbide powders in sealed tubes. Boron made by chemical vapor deposition (by the hydrogen reduction of boron trichloride) can be doped with controlled amounts of silicon carbide by the addition of metered amounts of an organosilane such as methyltrichlorosilane to the plating gas during the deposition process. Hence, a more convenient method of forming a continuous SiC-doped MgB2 wire is a process which includes forming a continuous SiC-doped boron substrate by chemical vapor deposition and subsequently converting the substrate to doped MgB2 by reaction with magnesium. The chemical vapor deposition process provides a means of fabricating a continuous substrate of controlled composition with a uniform dispersion of the dopant.

Similarly, carbon as a dopant can be incorporated into continuous MgB2 wires through a process as described above where a hydrocarbon is added to the plating gas during boron deposition instead of an organosilane.

Boron-containing coatings on silicon carbide are known (Suplinskas et al, U.S. Pat. No. 4,481,257) but their application is limited to enhancing the bonding in composites in which the silicon carbide provides the reinforcement. The application to the formation of superconducting wires is novel.

The doped boron coatings may be deposited on substrates other than silicon carbide fiber. Tungsten wires, molybdenum wires and carbon monofilament, for example, can be used for boron deposition and could be used as well for the deposition of doped boron. In this case, the specific mechanical property enhancement due to the use of silicon carbide would not result, but the improvement in superconducting properties such as superconducting critical current density and upper critical magnetic field would still be obtained after the coatings are reacted with magnesium to form magnesium diboride. The conversion to magnesium diboride has been illustrated by using the process of Caulfield et al, but other means of converting the doped boron to a superconductor are possible; for example, the continuous doped boron could be passed through a batch of molten magnesium. The method used for the reaction of the boron with magnesium is separate from the invention described here.

DETAILED DESCRIPTION OF THE EMBODIMENTS

Example 1

SCS-9 fiber, 3 mils in diameter, was passed through a reactor normally used for the deposition of continuous boron fiber. The continuous silicon carbide fiber enters the reactor at the top through a mercury gas seal and electrode, and exits at the bottom of the reactor through a similar seal/electrode. Fiber emerging from the bottom of the reactor is taken up on a variable speed take-up reel. The rate of fiber traverse through the reactor was 20 feet per minute. Reactant gases are admitted at the top of the reactor and exhausted at the bottom. Metered flows of 3.1 liters per minute of hydrogen and 4.2 liters per minute of boron trichloride were passed through the reactor. The silicon carbide was resistively heated by an electric current produced between mercury gas seals/electrodes at the top and bottom of the reactor. At a current of 200 milliamps, the silicon carbide fiber was heated to 1100-1300 degrees Celsius. The hydrogen flow was then directed to pass through a bubbler (coarse glass frit) containing liquid titanium tetrachloride. The bubbler was immersed in an ice-water bath; a thermocouple immersed in the TiCl4 read 3% C. The hydrogen/titanium tetrachloride mixture emerging from the bubbler was then mixed with the boron trichloride and passed through the reactor. The diameter of the fiber emerging from the reactor was approximately 3.3 mils compared to the 3 mil SCS-9 entering the reactor. A sample of this coated fiber was collected on the take up spool.

Examination of the collected sample showed a smooth uniform adherent coating approximately 4 microns thick. Auger analysis of the coating showed it to consist of approximately 90% boron and 10% titanium. Sections of this fiber were sealed in tantalum tubes with magnesium and heated to 950% C for one hour in the laboratory of Doug Finnemore at Iowa State University by the method described by Caulfield et al (loc.cit.). These converted fibers were superconducting with a transition temperature of about 39% K. Subsequent measurements showed a critical current density of 5 million amps per square centimeter at 5% K and a magnetic field of 0.1 Tesla. Similar measurements on superconductors made from pure boron gave maximum values of approximately 600,000 amps per square centimeter. The wires thus produced were handleable and could be bent around a half inch diameter without breaking.

Example 2

Silicon carbide fiber, 3 mils in diameter, was passed through the reactor described above. The rate of fiber traverse through the reactor was 20 feet per minute. Metered flows of 3.1 liters per minute of hydrogen and 4.2 liters per minute of boron trichloride vapor were passed through the reactor. The silicon carbide fiber was resistively heated to approximately 1100 degrees C. by a current of 162 milliamps. A portion of the hydrogen flow could be diverted through a bubbler (coarse glass frit) containing liquid methyltrichlorosilane at a temperature of 27-34 degrees C. In a series of experiments as described in the table below, the percentage of the total hydrogen flow that was diverted to the bubbler was varied systematically. In all cases, smooth adherent coatings 2-4 microns thick were formed on the silicon carbide. The composition of the coatings was determined by Energy Dispersive X-ray Analysis on a scanning electron microscope. The atomic percent silicon found in each case is noted in the table. The data demonstrates that controlled doping of the boron coatings was accomplished.

| Experiment Number | % Flow through Bubbler | Atomic % Silicon |
| --- | --- | --- |
| 1 | 0 | 0 |
| 2 | 18 | 1.5 |
| 3 | 36 | 5.0 |
| 4 | 55 | 6.3 |
| 5 | 73 | 8.1 |

Example 3

Silicon carbide fiber, 3 mils in diameter, was passed through the reactor described above. The rate of fiber traverse through the reactor was 20 feet per minute. Metered flows of 3.1 liters per minute of hydrogen and 4.2 liters per minute of boron trichloride vapor were passed through the reactor. The silicon carbide fiber was resistively heated by the passage of electrical current in the range 162-178 milliamps as indicated in the table below. A metered flow of methane gas in the range of 0-950 standard cubic centimeters per minute (SCCM) could be added to the reactor in addition to the hydrogen and boron trichloride. A series of experiments was performed in which the current and methane flow were varied as described in the table. In all cases, smooth adherent coatings 2-4 microns thick were formed on the silicon carbide. The composition of the coatings was determined by Energy Dispersive X-ray Analysis on a scanning electron microscope. The atomic percent carbon found in each case is noted in the table. The data demonstrates that controlled doping of the boron coatings was accomplished.

| Sample Number | Methane (SCCM) | Current (ma) | Atomic % Carbon |
| --- | --- | --- | --- |
| 1 | 0 | 165 | 0 |
| 2 | 250 | 162 | 1.5 |
| 4 | 500 | 170 | 3.3 |
| 6 | 950 | 178 | 6.3 |

DOCUMENTATION

These experiments are described in detail in my laboratory notebook entitled "B for superconductors" on pages 3-114.

What is claimed is:
1. A method for producing doped boron deposited as a doped boron coating on a substrate, said method comprising the steps of: introducing a boron-containing vapor into a reaction vessel; introducing a dopant vapor into the vessel to provide a mixture of the dopant vapor and the boron-containing vapor; and, heating the mixture by providing a heated substrate surface in the reaction vessel that contacts the mixture of the dopant vapor and the boron-containing vapor to produce a doped boron coating on the substrate.

2. The method according to claim 1 wherein the heated substrate surface is a surface of a heated silicon carbide fiber.

3. The method according to claim 1 wherein the heated substrate surface is a surface other than a heated silicon carbide fiber.

4. The method according to claim 1 wherein the heated substrate surface is selected from the group consisting of tungsten wires, molybdenum wires and carbon monofilament.

5. The method according to claim 1 wherein the boron-containing vapor is a hydrogen and boron trichloride mixture.

6. The method according to claim 1 wherein the dopant vapor is titanium tetrachloride vapor.

7. The method according to claim 4 wherein the boron-containing vapor is a hydrogen and boron trichloride vapor mixture.

8. The method according to claim 4 wherein the hydrogen and boron trichloride vapor mixture is a roughly stoichiometric mixture.

9. The method according to claim 1 wherein the dopant vapor is a hydrogen and titanium tetrachloride vapor mixture.

10. The method according to claim 1 wherein the dopant vapor is a hydrogen and methyltrichlorosilane vapor mixture.

11. The method according to claim 1 wherein the dopant vapor is methane gas.

12. The method of claim 6 wherein the boron-containing vapor is a hydrogen and boron trichloride vapor mixture.

13. The method of claim 12 wherein the hydrogen and boron trichloride vapor mixture is a roughly stoichiometric mixture.

14. The method of claim 5 wherein the dopant vapor is a hydrogen and titanium tetrachloride vapor mixture.

15. A method for producing doped boron comprising the steps of:
 (a) introducing a boron-containing vapor into a reaction vessel by metering a flow of hydrogen and metering a flow of boron trichloride vapor through the reaction vessel;
 (b) introducing a dopant vapor into the reaction vessel by passing at least a portion of the flow of hydrogen through a bubbler containing liquid titanium tetrachloride; mixing the hydrogen/titanium tetrachloride mixture emerging from the bubbler with the flow of boron trichloride going to the reaction vessel to form a boron-containing vapor/dopant-containing vapor mixture; and passing the boron-containing vapor/dopant-containing vapor mixture through the reaction vessel;
 (c) heating the boron-containing vapor/dopant-containing vapor mixture in the reaction vessel to produce doped boron; and,
 (d) depositing the doped boron as a coating on a substrate.

16. The method according to claim 15 wherein a metered flow of hydrogen at about 3.1 liters per minute and a metered flow of boron trichloride at about 4.2 liters per minute are flowed through the reaction vessel.

17. The method according to claim 15 wherein step (c) comprises the step of providing a heated surface inside the reaction vessel to heat the boron-containing vapor/dopant-containing vapor mixture.

18. The method according to claim 15 wherein step (c) comprises the steps of heating a silicon carbide fiber by electrical resistance heating to a temperature of about 1100-1300 degrees Celsius and passing said heated fiber through the reaction vessel in contact with the boron-containing vapor/dopant-containing vapor mixture.

19. A method for producing doped boron comprising the steps of:
 (a) introducing a boron-containing vapor into a reaction vessel by metering a flow of hydrogen and metering a flow of boron trichloride vapor through the reaction vessel;
 (b) introducing a dopant vapor into the reaction vessel by passing at least a portion of the flow of hydrogen through a bubbler containing liquid methyltrichlorosilane; mixing the hydrogen/methyltrichlorosilane mixture emerging from the bubbler with the flow of boron trichloride going to the reaction vessel to form in a boron-containing vapor/dopant-containing vapor mixture; and passing the boron-containing vapor/dopant-containing vapor mixture through the reaction vessel; and,
 (c) heating the boron-containing vapor/dopant-containing vapor mixture in the reaction vessel to produce doped boron.

20. The method according to claim 19 wherein a metered flow of hydrogen at about 3.1 liters per minute and a metered flow of boron trichloride at about 4.2 liters per minute are flowed through the reaction vessel.

21. The method according to claim 19 wherein step (c) comprises the step of providing a heated surface inside the reaction vessel to heat the boron-containing vapor/dopant-containing vapor mixture.

22. The method according to claim 19 wherein step (c) comprises the steps of heating a silicon carbide fiber by electrical resistance heating to a temperature of about 1100-1300 degrees Celsius and passing said heated fiber through the reaction vessel in contact with the boron-containing vapor/dopant-containing vapor mixture.

23. A method for producing doped boron comprising the steps of:
 (a) introducing a boron-containing vapor into a reaction vessel by metering a flow of hydrogen and metering a flow of boron trichloride vapor through the reaction vessel;
 (b) introducing a dopant vapor into the reaction vessel by metering a flow of methane gas into the reaction vessel together with the hydrogen and the boron trichloride; and,
 (c) heating the mixture of hydrogen, boron trichloride and methane in the reaction vessel to produce doped boron.

24. The method according to claim 23 wherein a metered flow of hydrogen at about 3.1 liters per minute, a metered flow of boron trichloride at about 4.2 liters per minute, and a metered flow of methane gas ranging up to about 950 standard cubic centimeters per minute (SCCM) are flowed through the reaction vessel.

25. The method according to claim 23 wherein step (c) comprises the step of providing a heated surface inside the reaction vessel to heat the mixture of hydrogen, boron trichloride and methane.

26. The method according to claim 23 wherein step (c) comprises the steps of heating a silicon carbide fiber by electrical resistance heating to a temperature of about 1100-1300 degrees Celsius and passing said heated fiber through the reaction vessel in contact with the mixture of hydrogen, boron trichloride and methane.

27. A method for producing doped boron comprising the steps of: introducing a boron-containing vapor into a reaction vessel; introducing a dopant vapor into the reaction vessel to provide a mixture of the dopant vapor and the boron-containing vapor; and, heating the mixture to produce doped boron; further wherein the dopant vapor is a hydrogen and methyltrichlorosilane vapor mixture.

28. A method for producing doped boron comprising the steps of introducing a boron-containing vapor into a reaction vessel; introducing a dopant vapor into the reaction vessel to provide a mixture of the dopant vapor and the boron-containing vapor; and, heating the mixture to produce doped boron; further wherein the dopant vapor is methane gas.

29. A method for producing doped boron comprising the steps of: introducing a boron-containing vapor into a reaction vessel; introducing a dopant vapor into the reaction vessel to provide a mixture of the dopant vapor and the boron-containing vapor; and, heating the mixture to produce doped boron; said method additionally comprising the step of depositing the doped boron as a coating on a substrate.

* * * * *